(12) United States Patent
Liebeskind

(10) Patent No.: US 7,294,914 B2
(45) Date of Patent: Nov. 13, 2007

(54) INTERCONNECT STRUCTURE

(75) Inventor: John Liebeskind, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 204 days.

(21) Appl. No.: 10/831,663

(22) Filed: Apr. 23, 2004

(65) Prior Publication Data

US 2004/0201016 A1    Oct. 14, 2004

Related U.S. Application Data

(62) Division of application No. 10/060,880, filed on Jan. 29, 2002, now Pat. No. 6,756,244.

(51) Int. Cl.
*H01L 23/02* (2006.01)

(52) U.S. Cl. .................. 257/678; 257/48; 257/E21.499; 257/E21.506; 257/E21.517; 257/E21.521

(58) Field of Classification Search ................ 257/678, 257/48, 621, 918, 737, 744, 749, 777, 100, 257/113, 114, 116, 421, 424, 428, 431, 432, 257/433, 427, 528
See application file for complete search history.

(56) References Cited

U.S. PATENT DOCUMENTS

| | | | | |
|---|---|---|---|---|
| 4,343,877 A | * | 8/1982 | Chiang | 430/5 |
| 5,166,605 A | * | 11/1992 | Daum et al. | 324/158 |
| 5,307,010 A | * | 4/1994 | Chiu | 324/158.1 |
| 5,444,366 A | * | 8/1995 | Chiu | 324/158.1 |
| 5,532,614 A | * | 7/1996 | Chiu | 324/763 |
| 5,613,861 A | * | 3/1997 | Smith et al. | 439/81 |
| 5,627,101 A | | 5/1997 | Lin et al. | |
| 5,807,763 A | * | 9/1998 | Motika et al. | 438/18 |
| 5,808,360 A | * | 9/1998 | Akram | 257/738 |
| 5,828,226 A | * | 10/1998 | Higgins et al. | 324/762 |
| 5,835,359 A | | 11/1998 | DiFrancesco | |
| 5,847,572 A | * | 12/1998 | Iwasaki et al. | 324/755 |
| 5,874,572 A | * | 2/1999 | Kim et al. | 324/755 |
| 5,899,703 A | * | 5/1999 | Kalter et al. | 438/18 |
| 6,078,186 A | | 6/2000 | Hembree et al. | |
| 6,107,109 A | * | 8/2000 | Akram et al. | 438/15 |
| 6,147,506 A | | 11/2000 | Ahmad et al. | |
| 6,242,935 B1 | * | 6/2001 | Akram | 324/765 |
| 6,246,245 B1 | | 6/2001 | Akram et al. | |
| 6,264,477 B1 | | 7/2001 | Smith et al. | |
| 6,278,286 B1 | | 8/2001 | Farnworth et al. | |
| 6,405,429 B1 | * | 6/2002 | Slemmons et al. | 29/827 |
| 6,491,968 B1 | * | 12/2002 | Mathieu et al. | 29/842 |
| 6,672,875 B1 | * | 1/2004 | Mathieu et al. | 439/66 |
| 6,799,976 B1 | * | 10/2004 | Mok et al. | 439/55 |
| 2001/0047496 A1 | | 11/2001 | Hidaka | |

FOREIGN PATENT DOCUMENTS

| | | |
|---|---|---|
| EP | 0 592 971 | 4/1994 |
| GB | 2 332 775 | 6/1999 |
| WO | WO 01/09623 | 2/2001 |

* cited by examiner

*Primary Examiner*—David Nhu

(57) ABSTRACT

An interconnect structure including a substrate, an interconnect device formed on the substrate, and a test device formed on the substrate.

31 Claims, 9 Drawing Sheets

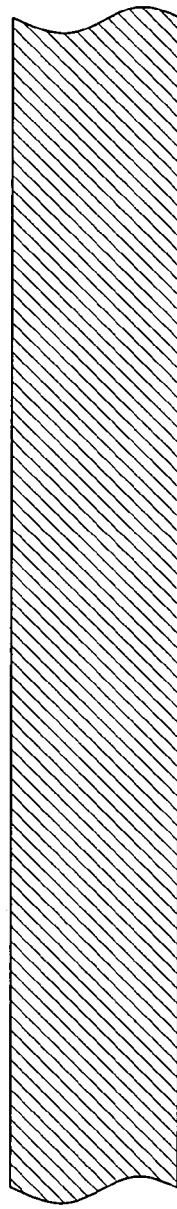
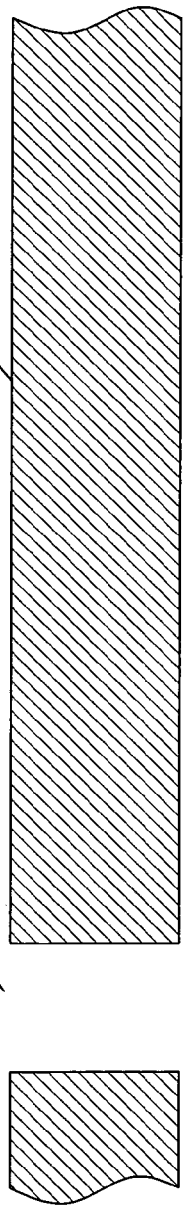
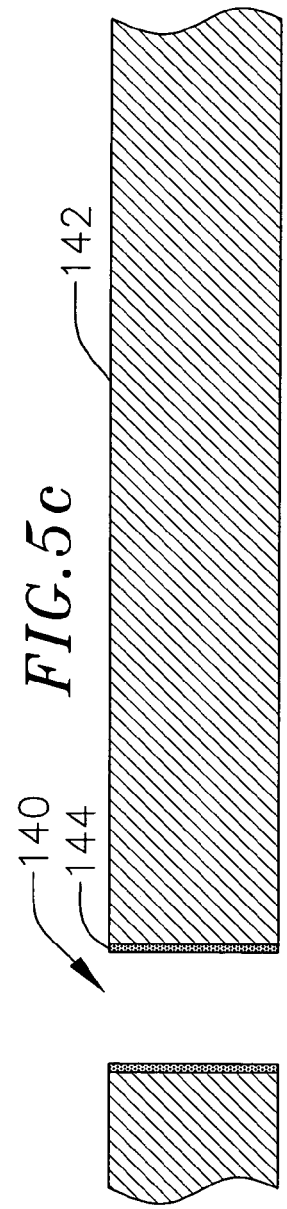
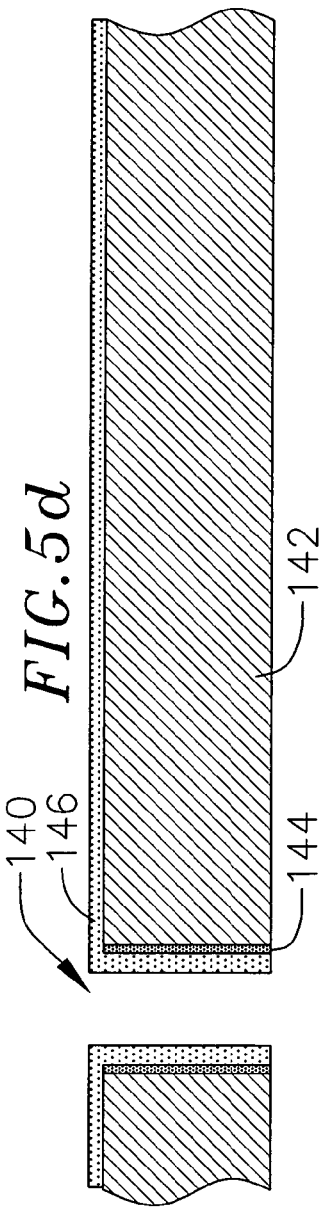

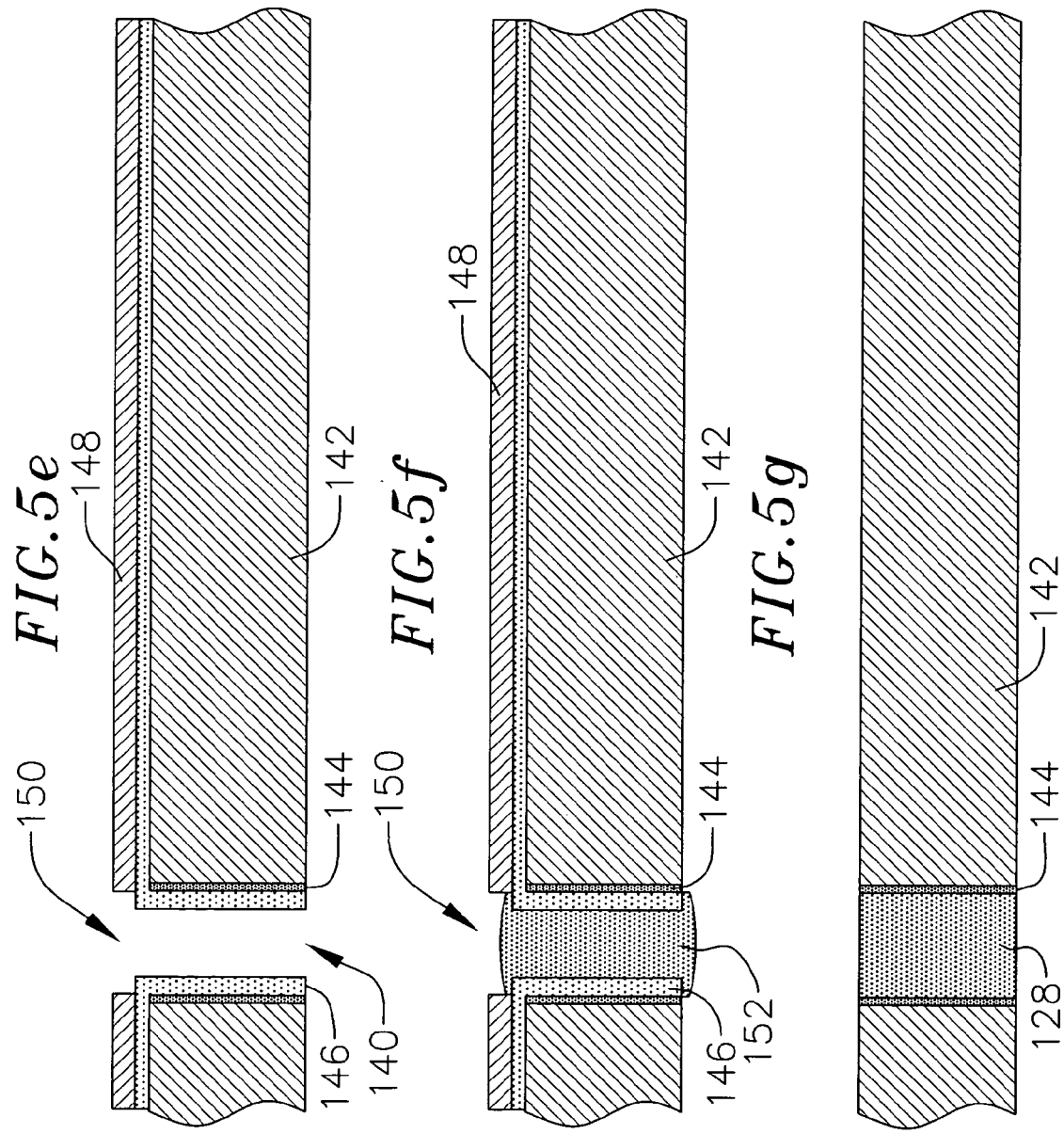

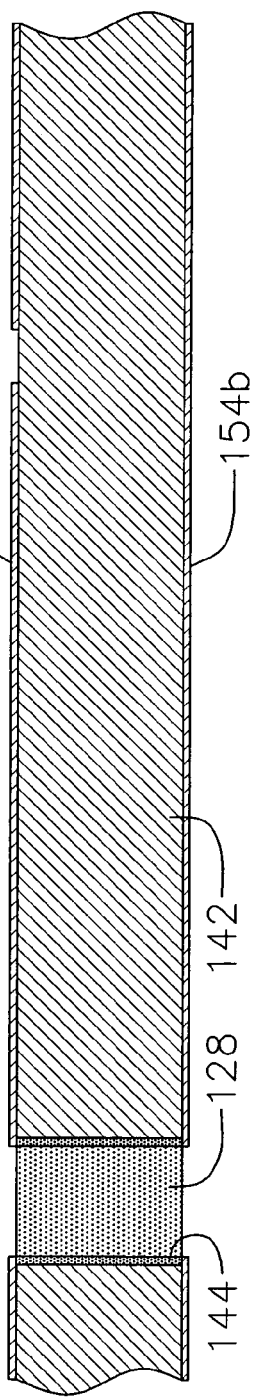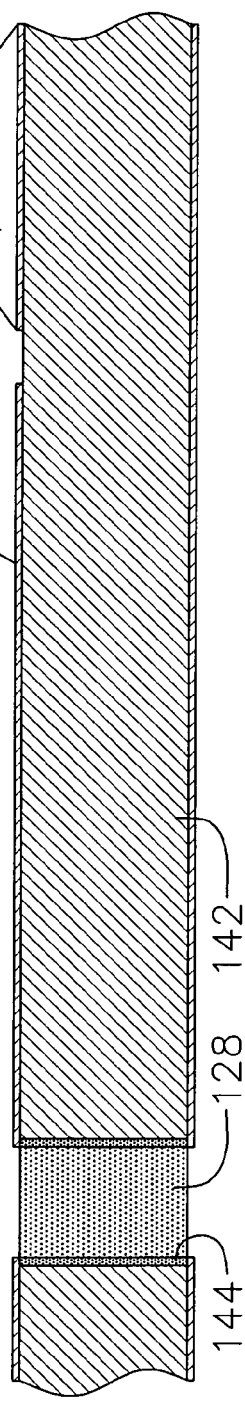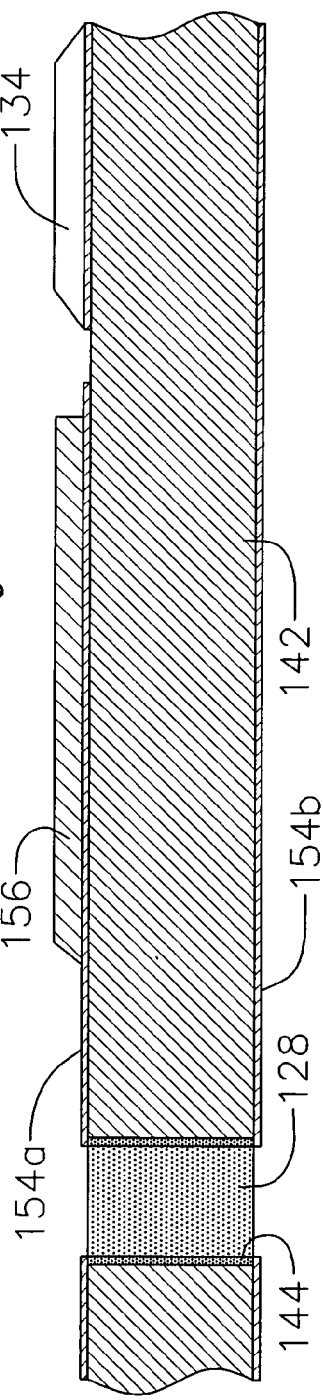

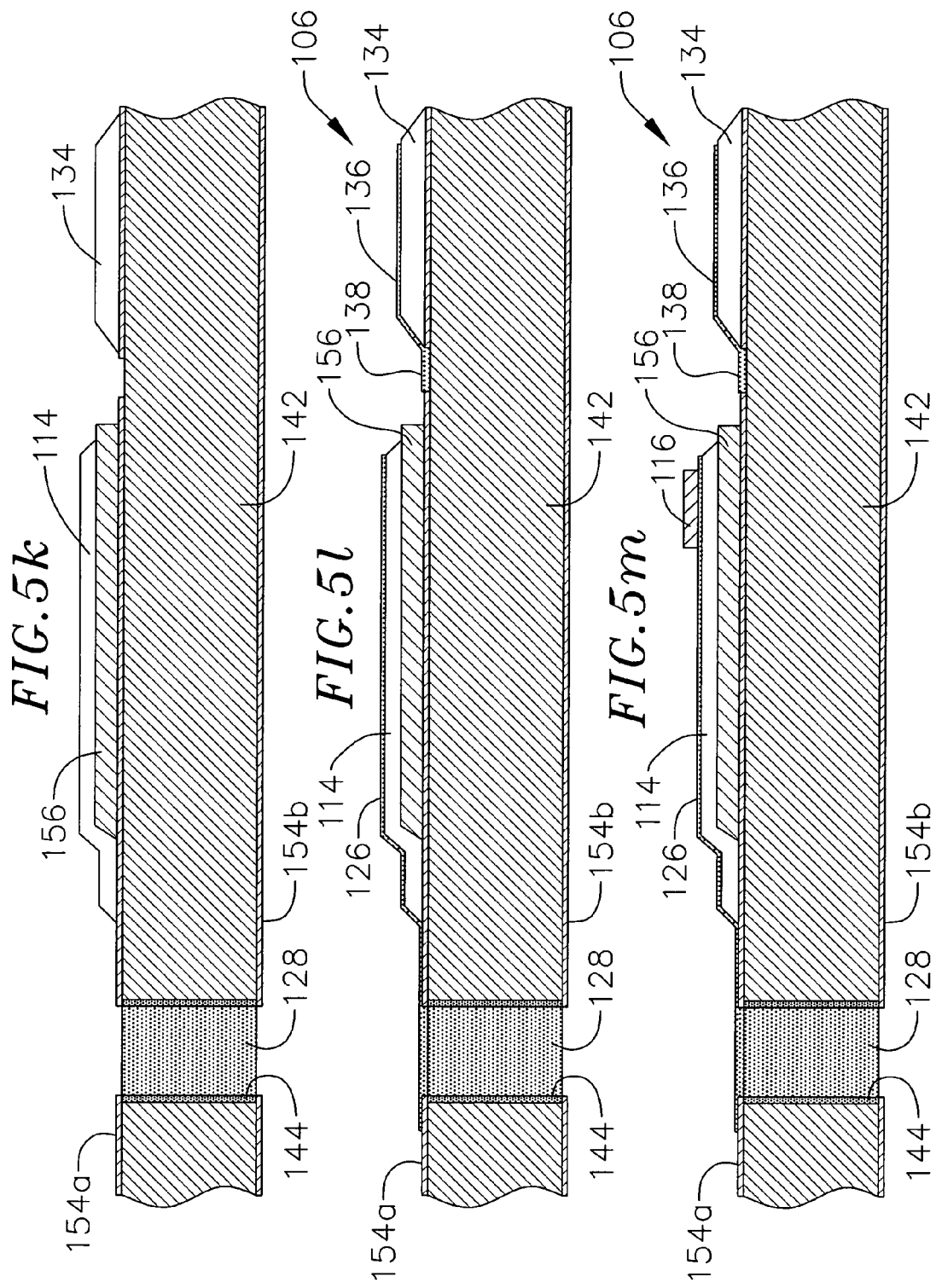

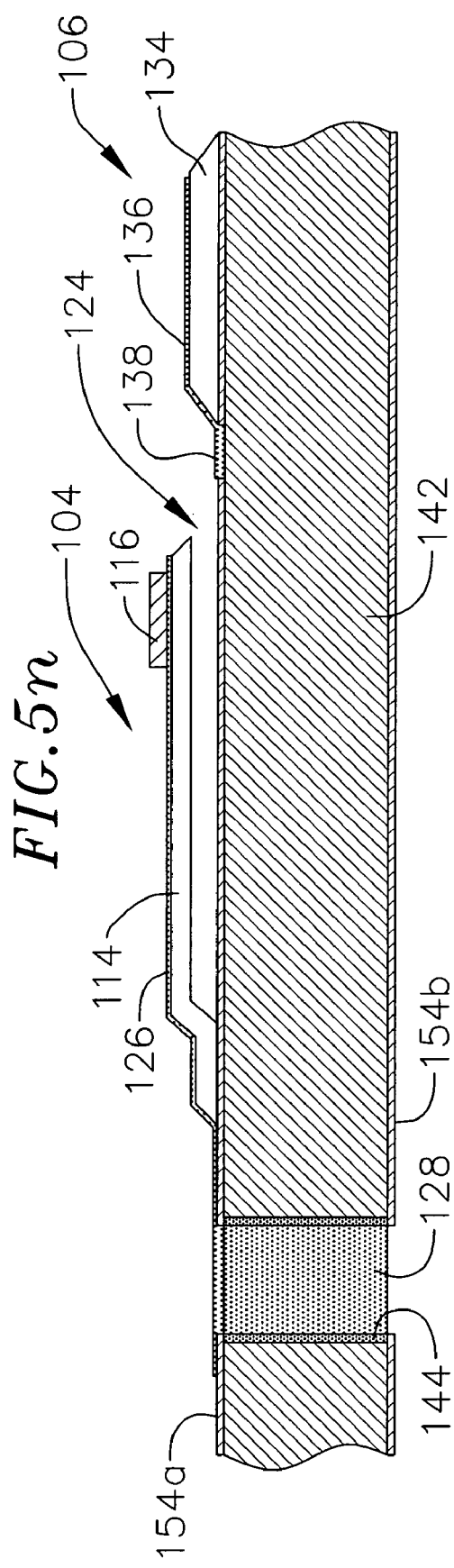
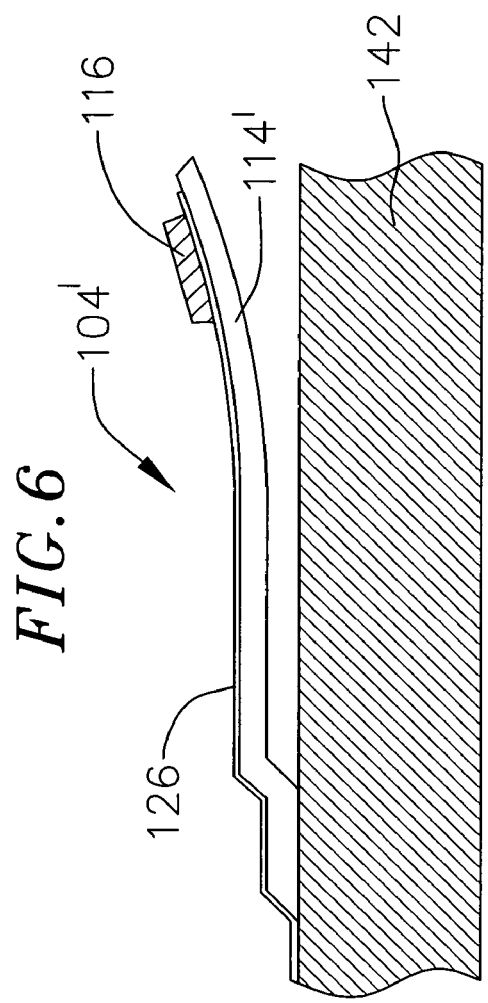

US 7,294,914 B2

INTERCONNECT STRUCTURE

CROSS REFERENCE TO RELATED APPLICATIONS(s)

This application is a divisional of application Ser. No. 10/060,880, filed Jan. 29, 2002, now U.S. Pat. No. 6,756,244, which is hereby incorporated by reference herein.

BACKGROUND OF THE INVENTIONS

1. Field of the Inventions

The present inventions are related to interconnect structures and, more specifically, to interconnect structures that may, for example, be used in conjunction with testing equipment.

2. Description of the Related Art

Interconnect structures are used in a wide variety of applications to electrically connect two devices to one another. Although the present inventions are not limited to any particular application, one application of interconnect structures is associated with the test procedures that are performed on wafers that include semiconductor components both during and after the fabrication process. The tests require that temporary electrical contact be made with contacts on the semiconductor components so that signals may be transferred to and from the components during the tests. Conventional testing equipment typically includes a series of pin contacts for this purpose. The pin contacts are part of an interconnect structure (sometimes referred to as a "probe card") that is manufactured using mechanical machining and assembly processes. Some wafers also have components, such as electron emitters, which emit signals that can be sensed to determine whether the component is operating properly. Some wafers are also tested with probes that supply a predetermined stimulus, such as light, to a particular component. The response to the stimulus, e.g. an electrical or optical signal, is then measured to determine whether the component is functioning properly.

The density and number of semiconductor component contacts has, of course, increased as semiconductor components have become smaller and smaller. The inventor herein has determined that, given the ever increasing density of semiconductor component contacts, conventional interconnect structures and the methods of manufacturing such interconnect structures are susceptible to improvement. For example, it is difficult, labor intensive and expensive to manufacture conventional pin contacts because the locational tolerances, both in and out of the semiconductor component plane, have become smaller as the density of the semiconductor component contacts has increased. Moreover, the increased number of component contacts has resulted in a corresponding increase in the number of pin contacts, which further increases the cost of manufacture. The inventor herein has also determined that the conventional methods of sensing emissions from wafer components, which is to do the testing after wafer has been diced and additional manufacturing steps (such as packaging) are performed on the individual chips, can be inefficient because the additional manufacturing steps are wasted in those instances where the wafer component is ultimately shown to be defective.

BRIEF DESCRIPTION OF THE DRAWINGS

Detailed description of preferred embodiments of the inventions will be made with reference to the accompanying drawings.

FIG. 1b is a partial plan view of the semiconductor substrate illustrated in FIG. 1a.

FIG. 2b is a plan view of a sub-array of interconnect devices and test devices in the interconnect structure illustrated in FIG. 2a.

FIGS. 5a-5n are side, partial section views showing various steps of an interconnect structure manufacturing process in accordance with a preferred embodiment of a present invention.

FIG. 6 is a side view of a portion of an interconnect structure in accordance with a preferred embodiment of a present invention.

DETAILED DESCRIPTION OF THE PREFERRED EMBODIMENTS

An interconnect structure in accordance with one embodiment of a present invention includes a substrate, an interconnect device formed on the substrate, and a test device formed on the substrate. Such an interconnect structure provides a number of advantages over conventional interconnect structures. For example, the present interconnect structures may be manufactured with processes, such as photolithographic processes, that facilitate greater density and locational tolerances and reduce marginal costs. The present inventions also enable the emissions from wafer components to be tested earlier in the manufacturing process, such as prior to dicing, which eliminates the inefficiencies associated with performing additional manufacturing steps (such as packaging) on a defective chip.

The following is a detailed description of the best presently known modes of carrying out the inventions. This description is not to be taken in a limiting sense, but is made merely for the purpose of illustrating the general principles of the inventions. Additionally, it is noted that detailed discussions of various internal operating components, such as specific details of the semiconductor component test equipment, have been omitted for the sake of simplicity. Also, although the exemplary embodiments are described in the context of semiconductor component test equipment, the present inventions are not limited to interconnect structures that are used with any particular apparatus.

Figure 1B:
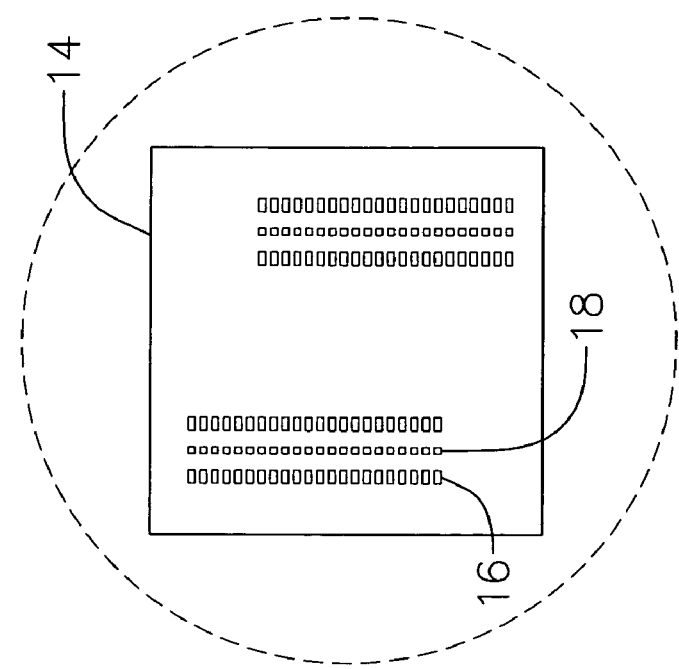
Figure 1A:
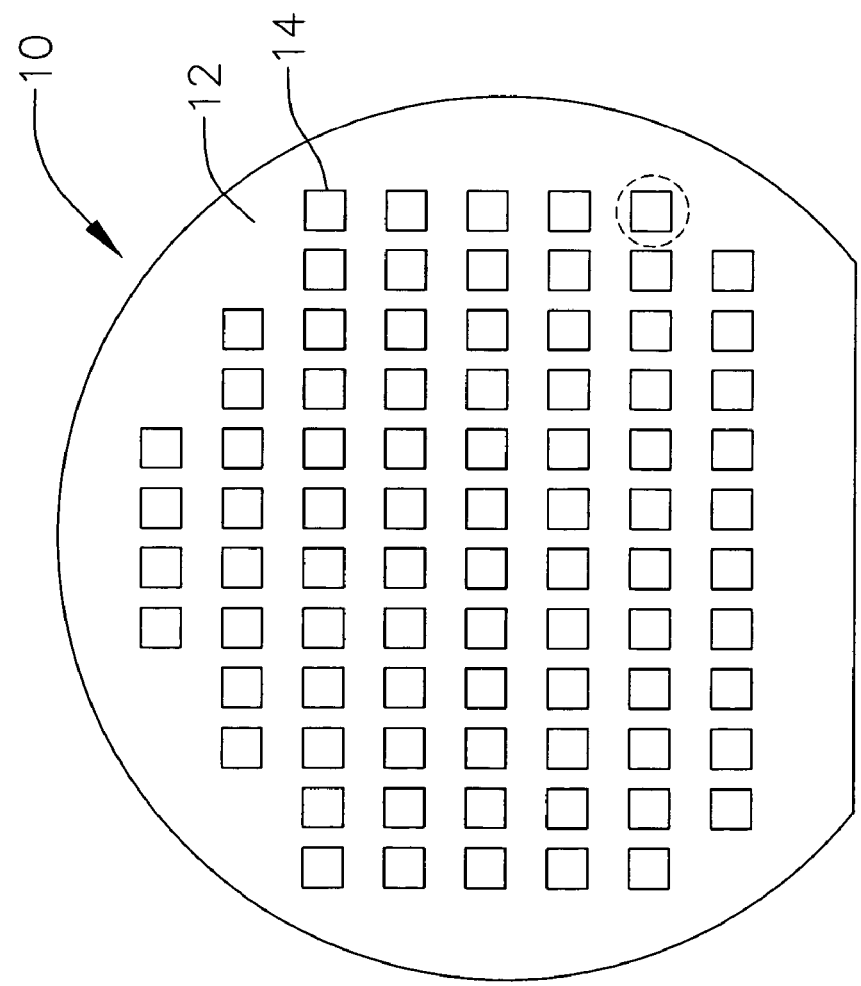
FIG. 1a is a plan view of an exemplary semiconductor substrate.

One specific example of a semiconductor substrate that may be tested using equipment containing the present interconnect devices is a semiconductor substrate 10 illustrated in FIGS. 1a and 1b. The semiconductor substrate 10 (or "test substrate") consists of a semiconductor wafer 12 and a plurality of identical dice 14 formed thereon. Each die 14 is provided with a plurality of component contacts 16, such as pads, arranged in a predetermined pattern. In the illustrated example, the pattern consists of four columns of contacts 16. Each die 14 also includes a plurality of testable devices 18, including devices whose emissions are susceptible to being sensed (referred herein as "sensed devices") and/or devices that are susceptible to being probed (referred to herein as "probed devices"). Sensed devices include, for example, devices that emit electron beams, such as those used in atomic resolution storage ("ARS") and field emission device ("FED") displays, devices that emit light, such as light emitting diodes ("LEDs"), and devices that create a magnetic field. Probed devices include, for example, digital micro-mirrors and other optical switches, micro electromechanical systems ("MEMS") motors and movable beams. In the illustrated example, the testable devices 18 are arranged in a predetermined pattern that consists of two columns, each between a respective pair of columns of contacts 16. It should be noted that specifics details concerning the substrate 10 are only provided to the extent that they are useful in illustrating how embodiments of the present inventions may be configured for specific applications and the substrate 10 is merely one example of such an application.

Figure 2B:
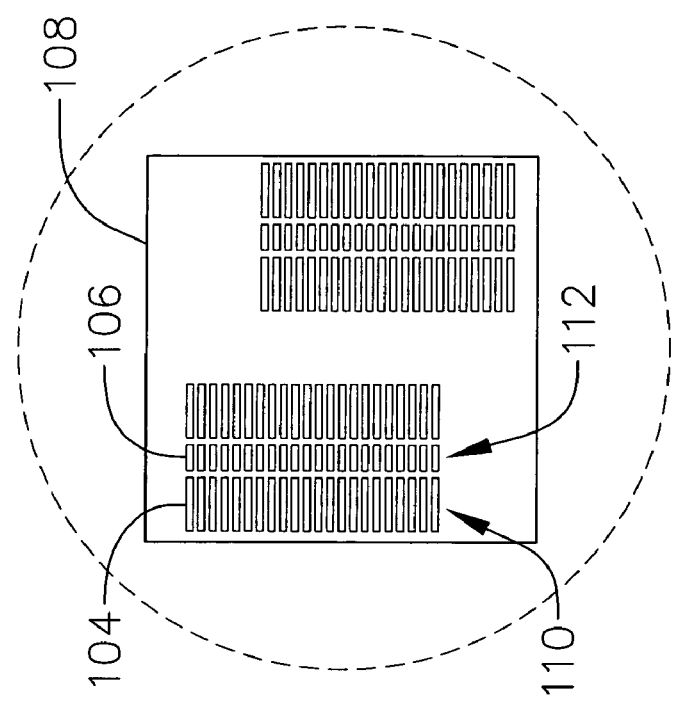
Figure 2A:
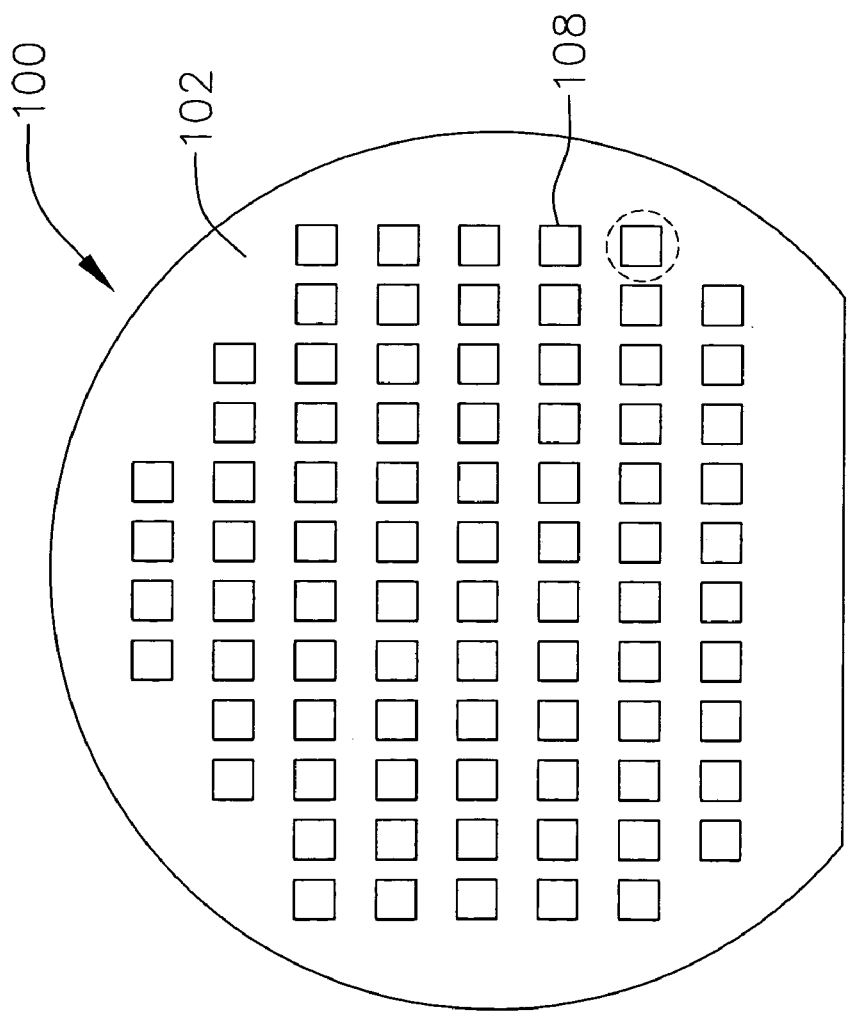
FIG. 2a is a plan view of an interconnect structure including an array of interconnect devices and test devices in accordance with a preferred embodiment of a present invention.

As illustrated for example in FIGS. 2a and 2b, an interconnect structure 100 in accordance with one embodiment of a present invention includes a base structure 102, which is preferably in the form of a silicon wafer, a glass wafer, a quartz wafer, a gallium arsenide wafer, or a wafer formed from other semiconducting or insulating materials, or any other desired material, that carries a plurality of interconnect devices 104 and test devices 106. In the exemplary embodiment, which is configured to test semiconductor components arranged in a plurality of dice 14 as illustrated in FIGS. 1a and 1b, the interconnect devices 104 and test devices 106 are arranged in sub-arrays 108 that correspond to respective dice. Each sub-array 108 in the exemplary embodiment includes four columns 110 of the interconnect devices 104 positioned in a manner corresponding to the position of the contacts 16 on the dice 14. The sub-arrays 108 also include two columns 112 of the test devices 106. So configured, each of the contacts 16 may be engaged by a corresponding interconnect device 104, and each of the testable devices 18 may be aligned with a corresponding test device 106, during testing procedure.

Of course, in other implementations and as other applications require, the configuration of the interconnect structure 100 in general, and the type, number, size, spacing and configuration of the interconnect devices 104 and test devices 106 in particular, will vary. Factors which influence the configuration of the interconnect structure 100, interconnect devices 104 and test devices 106 include the configuration of the device being tested (e.g. the semiconductor substrate 10) and the testing protocol.

Figures 3, 4:
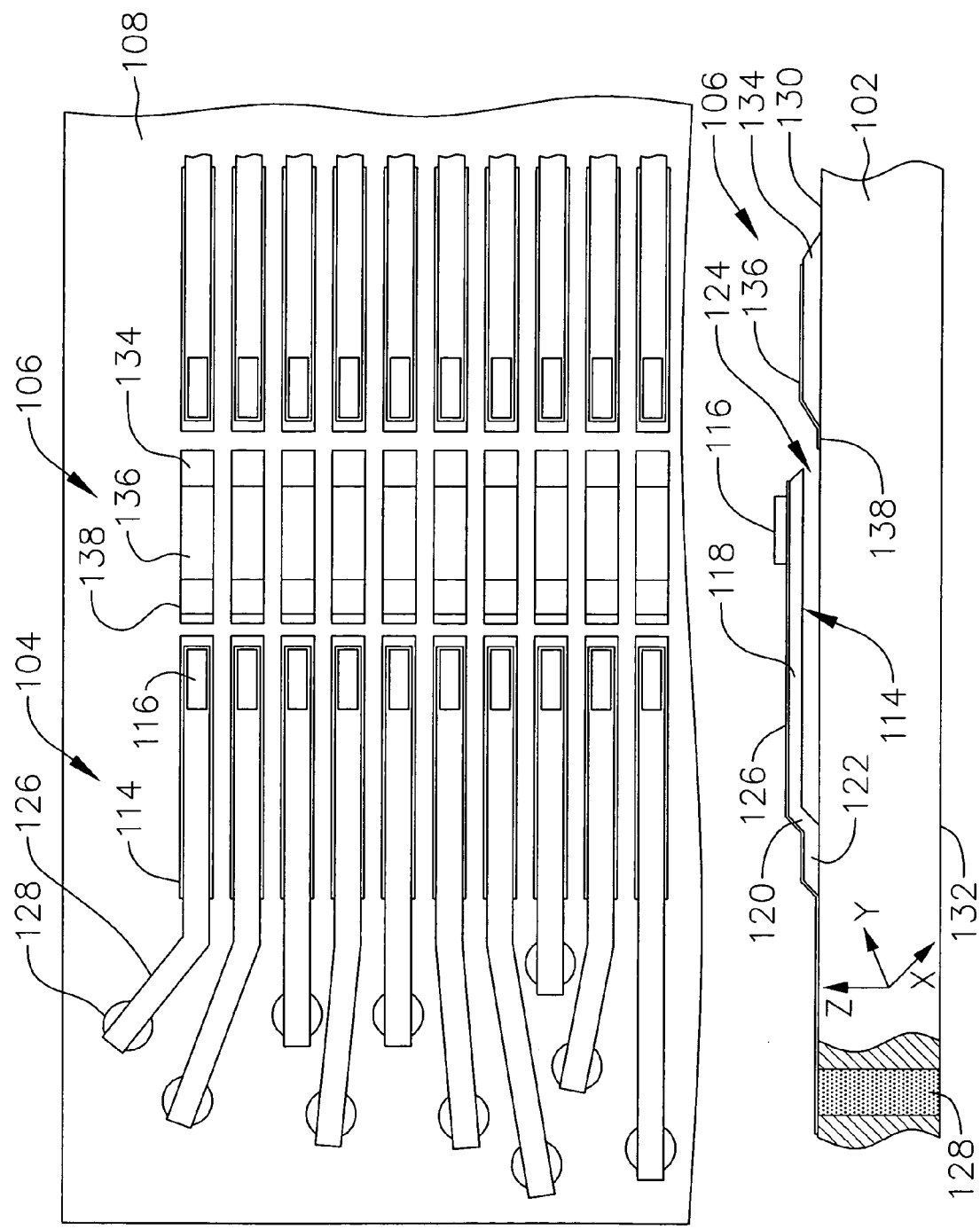
FIG. 3 is a partial plan view of a portion of the sub-array of interconnect devices and test devices illustrated in FIG. 2b.
FIG. 4 is a side view of an interconnect device and a test device in accordance with a preferred embodiment of a present invention.

Although not so limited, the interconnect devices are preferably resilient and movable in the Z-direction to facilitate reliable contact during testing procedures. Turning to FIGS. 3 and 4, the exemplary interconnect devices 104 include a deflectable beam structure 114 that carries a contact pad 116. The deflectable beam structure 114 consists of a main beam portion 118, an intermediate beam portion 120, and a base beam portion 122 that is mounted on the base structure 102. A space 124 is defined between the main beam portion 118 and the base structure 102 to enable deflection of the beam structure 114. Such deflection is advantageous because it increases the force between the contact pad 116 and the corresponding contact 16 on the test substrate. The amount of force is a function of the geometry of the beam structure 114 (i.e. length, width and thickness), the properties of the materials used to form the beam structure (primarily the elasticity and stress of the material), and the amount of beam deflection.

A device that conducts signals from the contact pads 116 to the portion of the interconnect structure 100 to which the test equipment is connected must also be provided. One method of providing such a conductor is to simply form the beam structure 114 from conductive material. Dielectric beam materials are, however, used in the preferred embodiment because of their mechanical properties. Accordingly, each of the exemplary interconnect devices 104 also includes an electrical conductor 126 that extends from the contact pad 116 to an electrical conductor 128, which itself extends from the top surface 130 of the base structure 102 (as oriented in FIG. 4) to the bottom surface 132. The bottom surface side of the electrical conductors 128 may be connected to semiconductor component test equipment.

Referring more specifically to FIG. 3, the electrical conductors 128 may be positioned relative to one another differently than the associated interconnect devices 104 and, in particular, may be spaced apart from one another by greater distances than the interconnect devices. This arrangement facilitates the connection of the bottom surface side of the electrical conductors 128 to be connected to, for example, test equipment using conventional electromechanical connectors such as pogo pins. As such, an arrangement of high density arrangement of contact pads 116 with a small pitch may be connected to test equipment connectors that have a larger pitch.

Although not limited to any particular type of test device, the test devices 106 in the exemplary interconnect structure 100 are electron collectors that measure properties of electron beams such as total current. As illustrated for example in FIGS. 3 and 4, the exemplary test devices 106 include a raised platform 134 and a collector 136 that is formed from conductive material. A conductor 138 connects the collector 136 to circuitry, such as multiplexing and amplifier circuits (discussed below), that is also formed on the substrate 102. The multiplexing circuits simplify and reduce the number of connections between the interconnect structure 100 and the test equipment (or "system"), while the on-board amplifier circuits provide a better signal-to-noise ratio than would be obtained if the amplifier circuits were not formed on the substrate 102. In addition to total current, the test devices 106 may be used to measure electron dispersion (by measuring current as a function of collector surface bias), electron beam spot size (by breaking the collector surface into segments that are smaller than the spot) and current distribution and diameter (a function of the current to each segment together with their respective sizes and locations). It should also be noted that other types of test devices, including the test devices disclosed herein, may used in conjunction with electron detectors in interconnect structures as applications so require.

Another type of test device that may be incorporated into embodiments of the present inventions, alone or in combination with other types of test devices, is a light detector. Technologies such as silicon-based photovoltaic and photodiode technologies may, for example, be used to measure the quantity of visible and near visible light (both infrared and ultraviolet) that is emitted from an optical source, such as an LED, on a substrate. The specific type of test device will, of course, depend on the optical source being sensed. Because the interconnect structure 100 may be placed in close proximity with accurate (e.g. better than 1 micron) alignment, an array of light detectors may be used to take spatially defined measurements. Dielectric optical coatings which form bandpass filters may also be used to measure the spectral distributions of optical sources.

Another type of test device that may be incorporated into embodiments of the present inventions, alone or in combination with other types of test devices, is a magnetic field detector, such as a hall effect sensor Still another type of device that may be incorporated into interconnect structures in accordance with the present inventions is a probe that supplies a predetermined stimulus, such as light, to a particular component. The response to the stimulus, e.g. an electrical or optical signal, is then measured to determine whether the component is functioning properly. Such probes may include, for example, LEDs and laser diodes that are formed on the base structure 102.

An exemplary process for manufacturing interconnect structures in accordance with the present inventions is illustrated in FIGS. 5a-5n. The process preferably takes advantage of MEMS and photolithography manufacturing techniques including wet and dry deposit and etch processes and lift off processes to form interconnect structures on a wafer. Additionally, although the explanation of the various process steps refer to a single interconnect device and test device, it should be understood that the present processes may be used to simultaneously form a plurality of interconnect and test devices in a predetermined pattern, such as the pattern illustrated in FIGS. 2a and 2b. Moreover, the processes may be used to form an interconnect structures that includes a variety of different interconnect devices and/or test devices.

For purposes of illustration, the exemplary process may be used to manufacture the interconnect structure 100, including the interconnect devices 104 and test devices 106, illustrated in FIGS. 2a-4. The first portion of the exemplary process forms the electrical conductors 128 and begins with the formation of a hole 140 in a wafer 142, such as a thermal oxide silicon wafer. [FIGS. 5a and 5b.] A suitable hole formation method is a deep reactive ion etch process such as the Bosch process. The surface of the hole 140 is then passivated by, for example, growing an oxide layer 144 on the surface (as shown) or depositing a dielectric layer on the surface. [FIG. 5c.] A conductive seed layer 146, such as chromium layer with a copper layer over the chromium layer, is then deposited onto the top surface (as oriented in FIGS. 5a-5n) of the wafer 142 and surface of the oxide layer 144. [FIG. 5d.] A photoresist pattern 148 is then formed on the conductive seed layer 146 that has a hole 150 that is slightly larger than the portion of the hole 140 that remains after the oxide layer 144 and conductive seed layer are formed. [FIG. 5e.] Electroplating material 152, such as copper, gold or palladium, is used to fill the hole 140. [FIG. 5f.] The electroplating material 152 will merge with the conductive seed layer 146 to form the conductor 128. Finally, the photoresist layer 148 will be stripped and the top and bottom surfaces of the wafer 142 polished flat down to the original wafer material (e.g. silicon). [FIG. 5g.] It should be noted that additional conductors 128 (not shown) for the circuitry that will be associated with the test devices 106 will also be formed. Of course, other suitable methods of forming through-wafer interconnects may also be used.

The next portion of the process is the formation of the circuitry (reference numeral 129 in FIG. 7), such as analog and CMOS multiplexer and amplifier circuits and circuits with higher level functions such as analog-to-digital converters and signal comparators, that will be associated with the test devices 106. Such circuitry may be formed by photolithography or other suitable methods. As noted above, the circuitry may be connected to electrical conductors 128 that extend to the bottom side of the wafer 142 for connection to, for example, a test system.

Passivation layers 154a and 154b, such as silicon nitride layers, are then deposited on both sides of the wafer 142 (and over the aforementioned test device circuitry) to protect the wafer and circuitry. The regions of the passivation layers 154a and 154b over the conductors 128 and the contact points between the test device circuitry and the test device 106 are etched away. [FIG. 5h.] The platform 134 for the test device 106 is then formed by depositing and etching a layer of tetraethylorthosilane ("TEOS"). [FIG. 5i.] Next, a sacrificial layer 156, such as a layer of borophosphosilicate glass ("BPSG") or other suitable material, is deposited onto the passivation layer 154a and etched in the manner shown. [FIG. 5j.] A layer of beam material is then deposited and etched to form the beam structure 114. [FIG. 5k.] Suitable beam materials include polysilicon and other suitable metals.

The formation of the conductor 126, collector 136 and conductor 138 is the next portion of the exemplary process. This may be accomplished by depositing a layer of conductive material, such as aluminum, titanium, palladium and titanium nitride, over at least the beam structure 114, conductor 128, platform 134 and passivation layer 154a, and sacrificial layer 156. The conductive layer is then etched as appropriate to form the conductor 126, collector 136 and conductor 138. [FIG. 5l.] This step also completes the formation of the exemplary test devices 106 which, as noted above, are electron collectors.

The contact pad 116 is then formed near the free end of the beam structure 114 by depositing and etching a layer of conductive material such as gold, aluminum, titanium, tin, molybdenum, tungsten, or titanium nitride, depending on the intended application. [FIG. 5m.] Gold is preferred because of its resistance to oxidation. The remaining portion of the sacrificial layer 156 is then etched away to form the space 124 between the main beam portion 118 and the base structure 102, which enables deflection of the beam structure 114. [FIGS. 4 and 5n.] This completes the formation of the interconnect devices 104.

An interconnect device 104' in accordance with another preferred embodiment is illustrated in FIG. 6. The interconnect device 104' is substantially similar to interconnect device 104. Similar reference numerals are used to represent similar structural elements and the exemplary method described above may be used for the most part to form the interconnect device. Here, however, the beam structure 114' is pre-stressed in the manner shown in order to increase the amount of contact force between the contact pad 116 and the test substrate. The beam structure 114' may be manufactured by, for example, forming multiple layers of beam material (instead of one) using a thin film deposition process that leaves the beam structure under compressive stress when completed.

Figure 7:
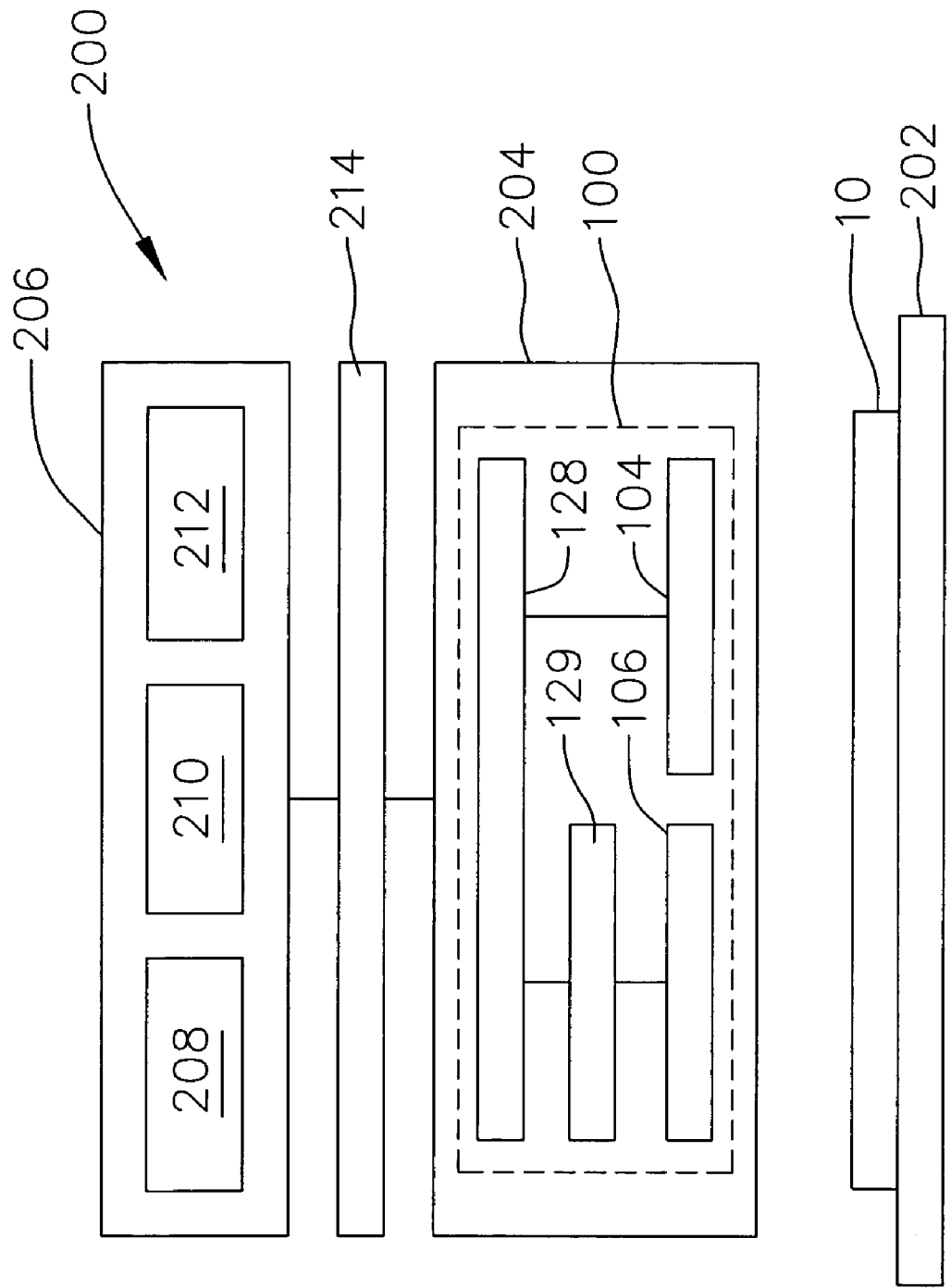
FIG. 7 is a diagrammatic view of a test system in accordance with a preferred embodiment of a present invention.

Turning to FIG. 7, an exemplary test system 200 in accordance with a preferred embodiment of a present invention includes a wafer handling system with a chuck 202 that aligns the semiconductor substrate 10 with the interconnect structure 100, a test head 204 that supports the interconnect structure, and a control system 206 including test circuitry 208, a processor 210 and an operator interface 212. The wafer handling system moves the chuck 202 in the X, Y and/or Z directions to bring the interconnect devices 104 into contact with the component contacts 16 on the semiconductor substrate 10 and to align the test devices 106 with the testable devices 18. Test devices 106 interface through circuitry 129 to conductors 128. The test circuitry 208 sends and receives signals associated with the testing processes by way of the interconnect structure 100. To that end, an interface board 214 connects the conductors 128 to the control system 206.

Although the present inventions have been described in terms of the preferred embodiments above, numerous modifications and/or additions to the above-described preferred embodiments would be readily apparent to one skilled in the art. It is intended that the scope of the present inventions extend to all such modifications and/or additions.

The invention claimed is:

1. An interconnect structure, comprising:
  a substrate;
  a plurality of interconnect devices on the substrate; and
  a test device on the substrate.

2. An interconnect structure as claimed in claim 1, wherein the substrate comprises a wafer formed from at least one of a semiconducting material and an insulative material.

3. An interconnect structure, comprising:
  a substrate defining first and second sides;
  an interconnect device on the first side of the substrate;
  a test device on the substrate; and
  an electrical conductor connected to the interconnect device and extending from the first side to the second side.

4. An interconnect structure, comprising:
  a substrate;
  an interconnect device, including a deflectable beam structure having a fixed end and a free end and a contact associated with the free end of the deflectable beam structure, formed on the substrate; and
  a test device formed on the substrate.

5. An interconnect structure as claimed in claim 1, wherein the test device comprises a plurality of test devices.

6. An interconnect structure as claimed in claim 1, wherein the test device comprises an electron collector.

7. An interconnect structure as claimed in claim 1, further comprising:
  circuitry on the substrate and operably connected to the test device.

8. An interconnect structure, comprising:
  a substrate formed from at least one of a semiconducting material and an insulative material and defining a first side and a second side;
  a plurality of interconnect devices formed on the first side of the substrate, each of the interconnect devices including a non-conductive deflectable beam structure having a fixed end and a free end and a conductive contact associated with the free end of the non-conductive deflectable beam structure;
  a plurality of test devices formed on the first side of the substrate;
  circuitry on the first side of the substrate;
  a plurality of first electrical conductors extending from the first side of the substrate to the second side of the substrate, some of the first electrical conductors being connected to the circuitry on the first side of the substrate;
  a plurality of second electrical conductors formed at least in part on the non-conductive deflectable beam structures and extending from respective contacts to respective other of the first electrical conductors;
  a plurality of third electrical conductors extending from respective test devices to respective portions of the circuitry.

9. An interconnect structure as claimed in claim 8, wherein the test devices comprise electron collectors.

10. An interconnect structure as claimed in claim 4, wherein the substrate comprises a wafer formed from at least one of a semiconducting material and an insulative material.

11. An interconnect structure as claimed in claim 4, wherein the substrate defines first and second sides and the interconnect device is formed on the first side, the interconnect structure further comprising:
  an electrical conductor connected to the interconnect device and extending from the first side to the second side.

12. An interconnect structure as claimed in claim 4, wherein the interconnect device comprises a plurality of interconnect devices.

13. An interconnect structure as claimed in claim 4, wherein the test device comprises a plurality of test devices.

14. An interconnect structure as claimed in claim 4, wherein the test device comprises an electron collector.

15. An interconnect structure as claimed in claim 4, further comprising:
  circuitry on the substrate and operably connected to the test device.

16. An interconnect structure as claimed in claim 3, wherein the substrate comprises a wafer formed from at least one of a semiconducting material and an insulative material.

17. An interconnect structure as claimed in claim 3, wherein the interconnect device comprises a plurality of interconnect devices.

18. An interconnect structure as claimed in claim 3, wherein the test device comprises a plurality of test devices.

19. An interconnect structure as claimed in claim 3, wherein the test device comprises an electron collector.

20. An interconnect structure as claimed in claim 3, further comprising:
  circuitry on the substrate and operably connected to the test device.

21. An interconnect, comprising:
  a substrate;
  a contact pad carried by the substrate; and
  a test device carried by the substrate.

22. An interconnect as claimed in claim 21, wherein the contact pad is secured to the substrate by a deflectable beam structure.

23. An interconnect as claimed in claim 21, wherein the interconnect device comprises a plurality of interconnect devices.

24. An interconnect as claimed in claim 21, wherein the test device comprises a plurality of test devices.

25. An interconnect as claimed in claim 21, wherein the test device comprises an electron collector.

26. An interconnect structure, comprising:
  a substrate;
  a plurality of interconnect devices on the substrate; and
  means, on the substrate, for sensing emissions from a sensed device.

27. An interconnect structure as claimed in claim 26, wherein the substrate comprises a wafer formed from at least one of a semiconducting material and an insulative material.

28. An interconnect structure as claimed in claim 26, wherein the interconnect devices include a deflectable beam structure having a fixed end and a free end and a contact associated with the free end.

29. An interconnect structure, comprising:
a substrate;
a plurality of interconnect devices on the substrate; and
means, on the substrate, for probing a probed device.

30. An interconnect structure as claimed in claim 29, wherein the substrate comprises a wafer formed from at least one of a semiconducting material and an insulative material.

31. An interconnect structure as claimed in claim 29, wherein the interconnect devices include a deflectable beam structure having a fixed end and a free end and a contact associated with the free end.

* * * * *